US010314207B1

United States Patent
Skalski et al.

(10) Patent No.: US 10,314,207 B1
(45) Date of Patent: Jun. 4, 2019

(54) POWER MODULE ASSEMBLY FOR A VEHICLE POWER INVERTER

(71) Applicant: Ford Global Technologies, LLC, Dearborn, MI (US)

(72) Inventors: Vincent T. Skalski, Plymouth, MI (US); Serdar Hakki Yonak, Ann Arbor, MI (US); Shailesh Shrikant Kozarekar, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/871,179

(22) Filed: Jan. 15, 2018

(51) Int. Cl.
*H02B 1/01* (2006.01)
*H05K 7/20* (2006.01)
*H05K 5/02* (2006.01)

(52) U.S. Cl.
CPC ....... *H05K 7/20872* (2013.01); *H05K 5/0291* (2013.01); *H05K 7/20927* (2013.01)

(58) Field of Classification Search
CPC ............. H05K 7/20872; H05K 7/0291; H05K 7/20927
USPC ....................................................... 361/831
See application file for complete search history.

(56) References Cited

U.S. PATENT DOCUMENTS

| 3,692,551 | A | 9/1972 | Weaver |
| 6,765,285 | B2 | 7/2004 | Shinohara et al. |
| 7,764,494 | B2 | 7/2010 | Balzano |
| 8,125,781 | B2 | 2/2012 | Mamitsu et al. |
| 8,363,403 | B2 * | 1/2013 | Tonomoto ........... H01L 23/4334 165/80.2 |
| 8,391,008 | B2 | 3/2013 | Dede |
| 9,723,764 | B2 | 8/2017 | Sugita |
| 9,941,187 | B2 * | 4/2018 | Yoshida .................. H01L 23/40 |
| 2012/0001341 | A1 * | 1/2012 | Ide ........................ H01L 23/473 257/773 |
| 2012/0119347 | A1 | 5/2012 | Mamitsu et al. |
| 2015/0138734 | A1 | 5/2015 | Guo |
| 2016/0309622 | A1 | 10/2016 | Lei et al. |
| 2016/0322281 | A1 | 11/2016 | Shintani et al. |

* cited by examiner

*Primary Examiner* — Hung S. Bui
(74) *Attorney, Agent, or Firm* — David Kelley; Brooks Kushman P.C.

(57) ABSTRACT

A power-module assembly includes plates defining pockets and arranged in a stack such that the pockets cooperate to define coolant chambers interleaved with the plates. The assembly further includes cards having a power module encased in a frame. The frame has an outward projecting spacer, and each card is disposed in a corresponding one of the chambers with the spacer contacting a wall of the corresponding chamber to form a coolant passage between the wall and the card.

19 Claims, 5 Drawing Sheets

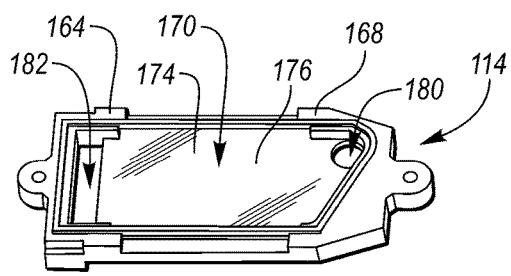
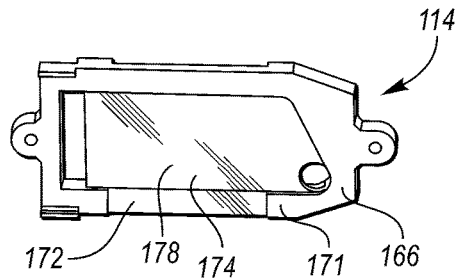
FIG. 6A  FIG. 6B
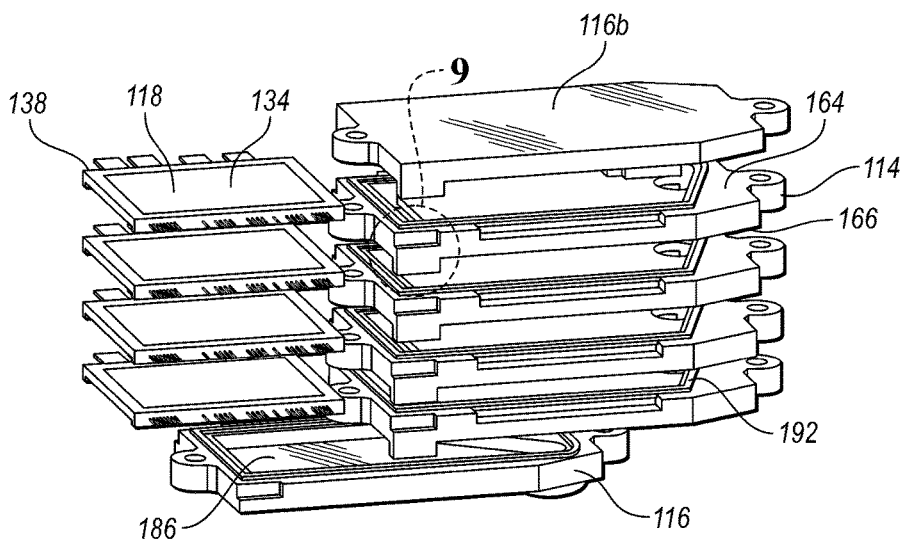
FIG. 7
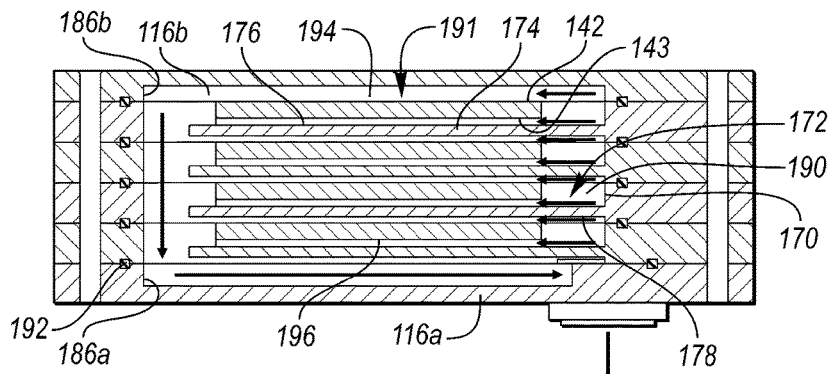
FIG. 8

US 10,314,207 B1

POWER MODULE ASSEMBLY FOR A VEHICLE POWER INVERTER

TECHNICAL FIELD

The present disclosure relates to power-module assemblies for power inverters of motor vehicles.

BACKGROUND

Vehicles such as battery-electric vehicles (BEVs), plug-in-hybrid-electric vehicles (PHEVs) and fully hybrid-electric vehicles (FHEVs) contain a traction battery assembly to act as an energy source for one or more electric machines. The traction battery includes components and systems to assist in managing vehicle performance and operations. A power inverter is electrically connected between the battery and the electric machines to convert the direct current coming from the battery into alternating current compatible with the electric machines. The power inverter may also act as a rectifier to convert alternating current from the electric machines to direct current compatible with the battery.

SUMMARY

According to one embodiment, a power-module assembly includes plates defining pockets and arranged in a stack such that the pockets cooperate to define coolant chambers interleaved with the plates. The assembly further includes cards having a power module encased in a frame. The frame has an outward projecting spacer, and each card is disposed in a corresponding one of the chambers with the spacer contacting a wall of the corresponding chamber to form a coolant passage between the wall and the card.

According to another embodiment, a power-module assembly includes stacked plates including adjacent first and second plates defining a first pocket and a second pocket, respectively. The pockets cooperate to form a coolant chamber. A first card is positioned in the coolant chamber such that a first coolant passage is defined between the first plate and the first card and a second coolant passage is defined between the second plate and the first card.

According to yet another embodiment, a power-module assembly includes plates each including first and second opposing major sides, a first pocket recessed into the first major side, a second pocket recessed into the second major side, and a dividing wall having a first surface that forms a floor of the first pocket and a second surface that forms a floor of the second pocket. The plates are arranged in a linear stack such that adjacent ones of the first and second pockets cooperate to define coolant chambers interleaved with the dividing walls. The assembly further includes cards having opposing first and second major faces and a power module encased in a frame that has a spacer extending from the second major face. Each of the cards is disposed in one of the coolant chambers with the spacer attached to a corresponding one of the dividing walls to support the card within the coolant chamber such that a first coolant passage is formed between the second major face of the card and the corresponding dividing wall and a second coolant passage is formed between the first major face of the card and another corresponding one of the dividing walls.

BRIEF DESCRIPTION OF THE DRAWINGS

FIG. 6A is a perspective view of a top side of a center plate of the power-module assembly.

FIG. 6B is a perspective view of a bottom side of the center plate.

FIG. 7 is an exploded perspective view of the power-module assembly.

FIG. 8 is a cross-sectional view of the power-module assembly.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
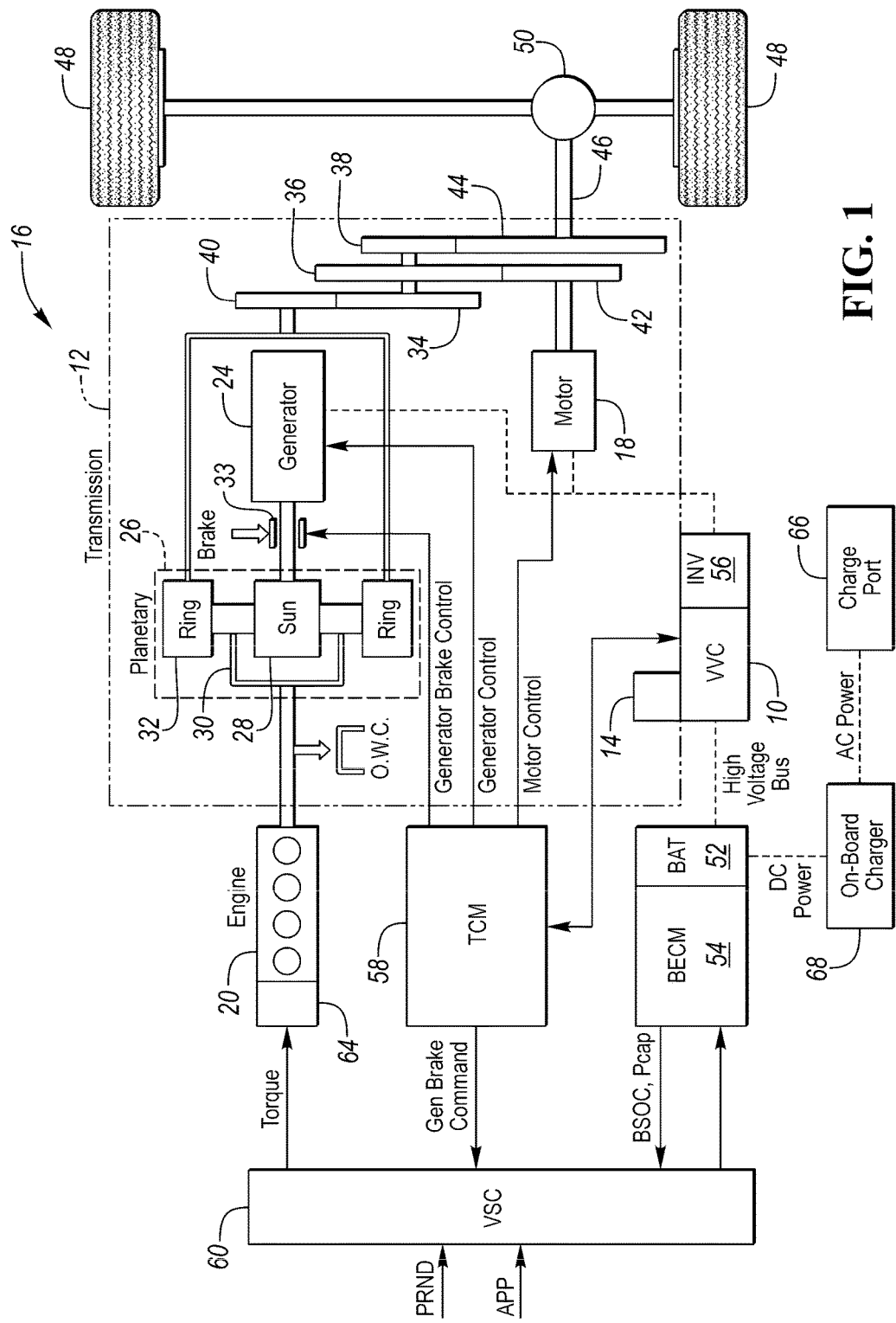
FIG. 1 is a schematic diagram of an example hybrid vehicle.

An example of a PHEV is depicted in FIG. 1 and referred to generally as a vehicle 16. The vehicle 16 includes a transmission 12 and is propelled by at least one electric machine 18 with selective assistance from an internal combustion engine 20. The electric machine 18 may be an alternating current (AC) electric motor depicted as "motor" 18 in FIG. 1. The electric machine 18 receives electrical power and provides torque for vehicle propulsion. The electric machine 18 also functions as a generator for converting mechanical power into electrical power through regenerative braking.

The transmission 12 may be a power-split configuration. The transmission 12 includes the first electric machine 18 and a second electric machine 24. The second electric machine 24 may be an AC electric motor depicted as "generator" 24 in FIG. 1. Like the first electric machine 18, the second electric machine 24 receives electrical power and provides output torque. The second electric machine 24 also functions as a generator for converting mechanical power into electrical power and optimizing power flow through the transmission 12. In other embodiments, the transmission does not have a power-split configuration.

The transmission 12 may include a planetary gear unit 26, which includes a sun gear 28, a planet carrier 30, and a ring gear 32. The sun gear 28 is connected to an output shaft of the second electric machine 24 for receiving generator torque. The planet carrier 30 is connected to an output shaft of the engine 20 for receiving engine torque. The planetary gear unit 26 combines the generator torque and the engine torque and provides a combined output torque about the ring gear 32. The planetary gear unit 26 functions as a continuously variable transmission, without any fixed or "step" ratios.

The transmission 12 may also include a one-way clutch (O.W.C.) and a generator brake 33. The O.W.C. is coupled to the output shaft of the engine 20 to only allow the output shaft to rotate in one direction. The O.W.C. prevents the transmission 12 from back-driving the engine 20. The generator brake 33 is coupled to the output shaft of the second electric machine 24. The generator brake 33 may be activated to "brake" or prevent rotation of the output shaft of the second electric machine 24 and of the sun gear 28. Alternatively, the O.W.C. and the generator brake 33 may be eliminated and replaced by control strategies for the engine 20 and the second electric machine 24.

The transmission 12 may further include a countershaft having intermediate gears including a first gear 34, a second gear 36 and a third gear 38. A planetary output gear 40 is connected to the ring gear 32. The planetary output gear 40 meshes with the first gear 34 for transferring torque between the planetary gear unit 26 and the countershaft. An output gear 42 is connected to an output shaft of the first electric machine 18. The output gear 42 meshes with the second gear 36 for transferring torque between the first electric machine 18 and the countershaft. A transmission output gear 44 is connected to a driveshaft 46. The driveshaft 46 is coupled to a pair of driven wheels 48 through a differential 50. The transmission output gear 44 meshes with the third gear 38 for transferring torque between the transmission 12 and the driven wheels 48.

The vehicle 16 includes an energy storage device, such as a traction battery 52 for storing electrical energy. The battery 52 is a high-voltage battery that is capable of outputting electrical power to operate the first electric machine 18 and the second electric machine 24. The battery 52 also receives electrical power from the first electric machine 18 and the second electric machine 24 when they are operating as generators. The battery 52 is a battery pack made up of several battery modules (not shown), where each battery module contains a plurality of battery cells (not shown). Other embodiments of the vehicle 16 contemplate different types of energy storage devices, such as capacitors and fuel cells (not shown) that supplement or replace the battery 52. A high-voltage bus electrically connects the battery 52 to the first electric machine 18 and to the second electric machine 24.

The vehicle includes a battery energy control module (BECM) 54 for controlling the battery 52. The BECM 54 receives input that is indicative of vehicle conditions and battery conditions, such as battery temperature, voltage and current. The BECM 54 calculates and estimates battery parameters, such as battery state of charge and the battery power capability. The BECM 54 provides output (BSOC, $P_{cap}$) that is indicative of a battery state of charge (BSOC) and a battery power capability ($P_{cap}$) to other vehicle systems and controllers.

The vehicle 16 includes a DC-DC converter or variable voltage converter (VVC) 10 and an inverter 56. The VVC 10 and the inverter 56 are electrically connected between the traction battery 52 and the first electric machine 18, and between the battery 52 and the second electric machine 24. The VVC 10 "boosts" or increases the voltage potential of the electrical power provided by the battery 52. The VVC 10 also "bucks" or decreases the voltage potential of the electrical power provided to the battery 52, according to one or more embodiments. The inverter 56 inverts the DC power supplied by the battery 52 (through the VVC 10) to AC power for operating the electric machines 18, 24. The inverter 56 also rectifies AC power provided by the electric machines 18, 24, to DC for charging the traction battery 52. Other embodiments of the transmission 12 include multiple inverters (not shown), such as one invertor associated with each electric machine 18, 24. The VVC 10 includes an inductor assembly 14.

The transmission 12 includes a transmission control module (TCM) 58 for controlling the electric machines 18, 24, the VVC 10 and the inverter 56. The TCM 58 is configured to monitor, among other things, the position, speed, and power consumption of the electric machines 18, 24. The TCM 58 also monitors electrical parameters (e.g., voltage and current) at various locations within the VVC 10 and the inverter 56. The TCM 58 provides output signals corresponding to this information to other vehicle systems.

The vehicle 16 includes a vehicle system controller (VSC) 60 that communicates with other vehicle systems and controllers for coordinating their function. Although it is shown as a single controller, the VSC 60 may include multiple controllers that may be used to control multiple vehicle systems according to an overall vehicle control logic, or software.

The vehicle controllers, including the VSC 60 and the TCM 58 generally includes any number of microprocessors, ASICs, ICs, memory (e.g., FLASH, ROM, RAM, EPROM and/or EEPROM) and software code to co-act with one another to perform a series of operations. The controllers also include predetermined data, or "look up tables" that are based on calculations and test data and stored within the memory. The VSC 60 communicates with other vehicle systems and controllers (e.g., the BECM 54 and the TCM 58) over one or more wired or wireless vehicle connections using common bus protocols (e.g., CAN and LIN). The VSC 60 receives input (PRND) that represents a current position of the transmission 12 (e.g., park, reverse, neutral or drive). The VSC 60 also receives input (APP) that represents an accelerator pedal position. The VSC 60 provides output that represents a desired wheel torque, desired engine speed, and generator brake command to the TCM 58; and contactor control to the BECM 54.

The vehicle 16 includes an engine control module (ECM) 64 for controlling the engine 20. The VSC 60 provides output (desired engine torque) to the ECM 64 that is based on a number of input signals including APP, and corresponds to a driver's request for vehicle propulsion.

If the vehicle 16 is a PHEV, the battery 52 may periodically receive AC energy from an external power supply or grid, via a charge port 66. The vehicle 16 also includes an on-board charger 68, which receives the AC energy from the charge port 66. The charger 68 is an AC/DC converter which converts the received AC energy into DC energy suitable for charging the battery 52. In turn, the charger 68 supplies the DC energy to the battery 52 during recharging. Although illustrated and described in the context of a PHEV 16, it is understood that the inverter 56 may be implemented on other types of electric vehicles, such as a HEV or a BEV.

Figure 2:
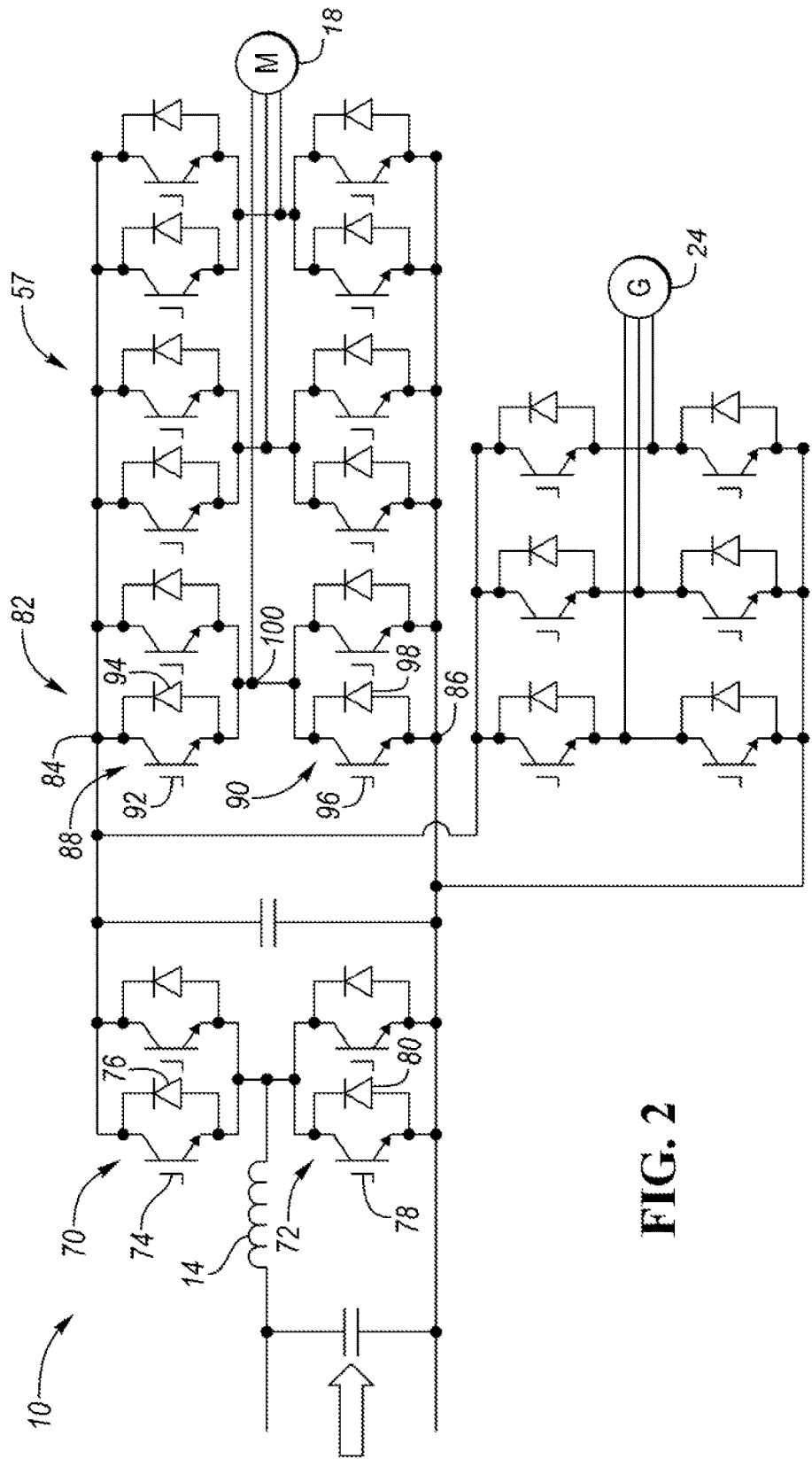
FIG. 2 is a schematic diagram of a variable voltage converter and a power inverter.

Referring to FIG. 2, an electrical schematic of the VVC 10 and the power-module assembly 57 of the power inverter 56 is shown. The VVC 10 may include one or more power modules having at least a first switching unit 70 and a second switching unit 72 for boosting the input voltage ($V_{bat}$) to provide output voltage ($V_{dc}$). The first switching unit 70 may include a first transistor 74 connected in parallel to a first diode 76, but with their polarities switched (anti-parallel). In one embodiments, the switch 70 may be a reverse conducting insulated gate bipolar transistor (RCIGBT). The second switching unit 72 may include a second transistor 78 connected anti-parallel to a second diode 80. Each transistor 74, 78 may be any type of controllable switch (e.g., an insulated gate bipolar transistor (IGBT) or field-effect transistor (FET)). Additionally, each transistor 74, 78 may be individually controlled by the TCM 58. The inductor assembly 14 is depicted as an input inductor that is connected in series between the traction battery 52 and the switching units 70, 72. The inductor 14 generates magnetic flux when a current is supplied. When the current flowing through the inductor 14 changes, a time-varying magnetic field is created, and a voltage is induced. Other embodiments of the VVC 10 include alternative circuit configurations.

The power-module assembly 57 may include a plurality of power modules that are stacked in an assembly. Each of the power modules may include one or more half bridges 82 having a positive DC lead 84 that is coupled to a positive DC node from the battery and a negative DC lead 86 that is coupled to a negative DC node from the battery. Each of the half bridges 82 may also include a first switching unit 88 and a second switching unit 90. The first switching unit 88 may include a first transistor 92 connected in parallel to a first diode 94. The second switching unit 90 may include a second transistor 96 connected in parallel to a second diode 98. The first and second transistors 88, 96 may be IGBTs or FETs. The first and second switching units 88, 90 may be similar to the switching units 70, 72. The first and second switching units of the each of the half bridges 82 convert the DC power of the battery into a single phase AC output at the AC lead 100. Each of the AC leads 100 are electrically connected to the motor 18 or generator 24.

Figure 3:
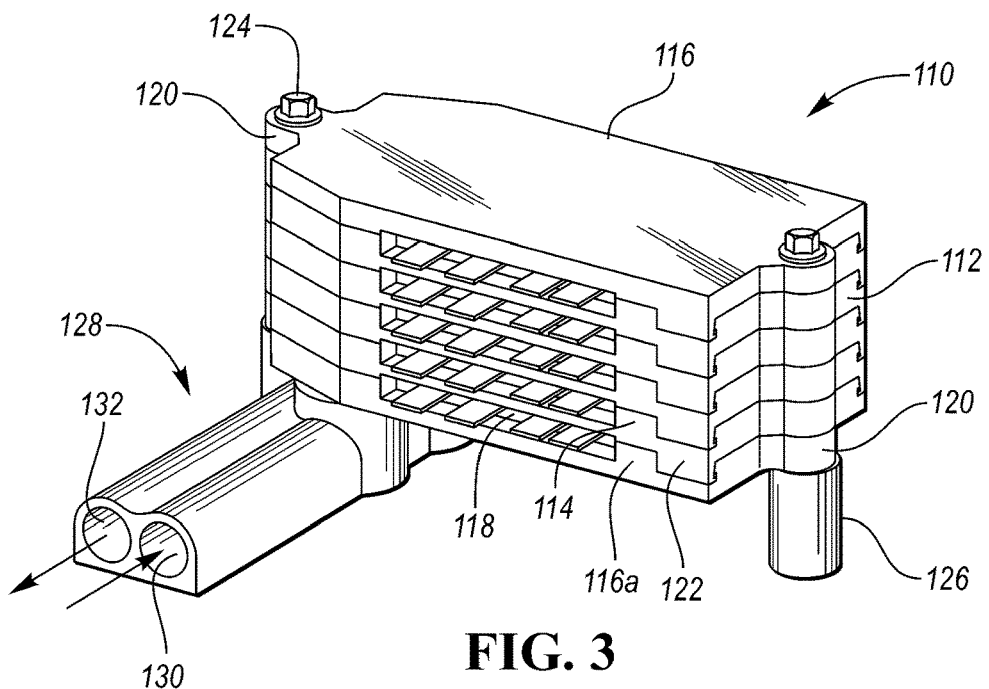
FIG. 3 is a perspective view of a power-module assembly of the power inverter.

FIGS. 3 to 10 and the related discussion describe example power-module assemblies for the inverter 56. Referring to FIG. 3, an example power-module assembly 110 includes a plurality of plates linearly arranged in a stack 112. The stack 112 includes a plurality of central plates 114 sandwiched between a pair of endplates 116. A plurality of cards 118 are interleaved with the plates 114, 116. The plates and the cards 118 have features that cooperate to define a plurality of coolant chambers within the stack 112. Coolant is circulated through these chambers to cool or heat the cards 118. (This will be described in more detail below.)

The plates 114, 116 may include connection features 122 that secure adjacent plates to each other. The connection features 122 may include a first portion on one of the adjacent plates and a second portion on the other of the adjacent plates. The first and second portions engage with each other to connect the plates. Each of the plates 114, 116 have bosses 120 on opposing sides of the plate. Each of the bosses 120 may define a hole for receiving a connecting rod 124 therethrough. The connecting rods 124 may be used to secure the plates 114, 116 to each other as well is secure the power-module assembly 110 to the vehicle. A threaded end of the connecting rods 124 may attach with vehicle mounts 126 to secure the power-module assembly 110 to the vehicle.

A coolant manifold 128 provides coolant into and out of the power-module assembly 110. The manifold 128 may be mounted to endplate 116a. Endplate 116a may define an inlet port and an outlet port that are in fluid communication with the coolant chambers. An inlet 130 of the manifold 128 is coupled to the inlet port defined in the end plate 116a, and an outlet 132 of the manifold 128 is coupled to the outlet port defined in the end plate 116a. A distal end of the coolant manifold 128 is connected with a thermal-management system configured to supply coolant to the manifold 128 to heat or cool the power-module assembly 110 depending upon operating conditions.

Figure 4:
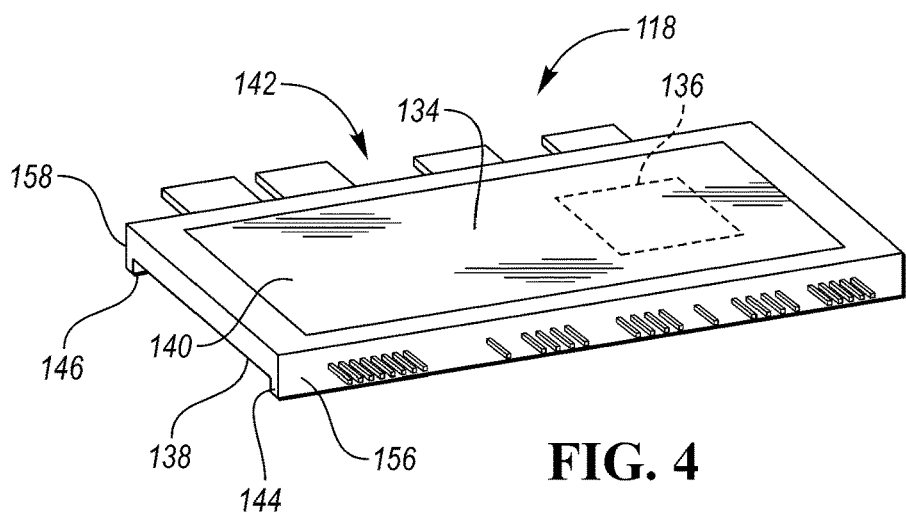
FIG. 4 is a perspective view of a card of the power-module assembly.
Figure 5:
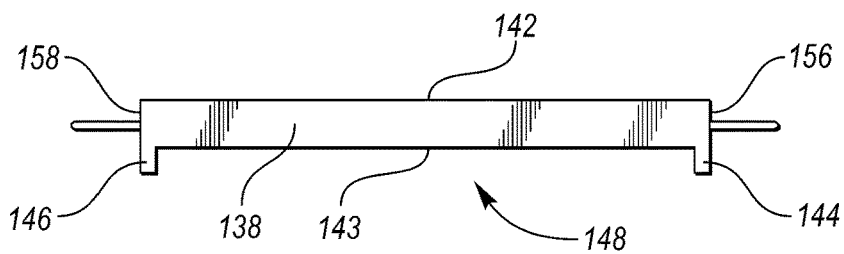
FIG. 5 is a side view of the card.

Referring to FIGS. 4 and 5, each of the cards 118 includes a power module 134 encased in a frame 138. The power module 134 includes one or more switching units 136 sandwiched between a pair of substrates. Each of the substrates includes an outer panel 140 that is electrically isolated from the electrical componentry of the power module 134.

Each card 118 includes opposing major faces 142, 143. The frame 138 may be open on the major faces 142, 143 to expose the outer panels 140. This allows coolant to flow directly across the outer panels 140 and more efficiently heat/cool the power modules 134. The frame 138 has a first projecting wall 144 extending past the major face 143 and located on a first edge 156 of the card 118, and a second projecting wall 146 extending past the major face 143 and located on a second edge 158 of the card 118. The first and second projecting walls 144 and 146 are spaced apart to define a channel 148. The first and second projecting walls 144, 146 may be integrally formed with the frame 138. The first and second walls 144, 146 may be referred to as a spacer.

Referring to FIGS. 6A and 6B, each of the central plates 114 may include a top side 164 and a bottom side 166, which may be referred to as major sides. The top side 164 may include one or more engaging surfaces 168 and a recessed top pocket 170, and the bottom side 166 may include one or more engaging surfaces 171 and a recessed bottom pocket 172. Each central plate 114 may include a dividing wall 174 that separates the top pocket 170 and the bottom pocket 172. The dividing wall 174 includes a top surface 176 that defines a floor of the top pocket 170 and a bottom surface 178 that defines a floor of the bottom pocket 172. The dividing wall 174 may define an inlet port 180 and an outlet port 182 disposed on opposing sides of the plate 114. The top pocket 170 may be recessed deeper than the bottom pocket. The depth of the top pocket may be substantially equal to the thickness of the card 118. In an alternative embodiment, each of the plates only has a top pocket and the bottom side of the plate is flat.

Referring to FIGS. 7 and 8, each of the endplates 116 also defines a pocket 186. For example, endplate 116a defines pocket 186a, and endplate 116b defines pocket 186b. The central plates 114 are arranged in a stack such that the top sides 164 and the bottom sides 166 of adjacent plates abut each other with the engaging surfaces 168 and 171 in contact, and such that the top pockets 170 and the bottom pockets 172 of adjacent plates cooperate to define coolant chambers 190 interleaved with the dividing walls 174. Gaskets 192 may be disposed between adjacent plates to seal the coolant chambers 190. The top side 164 may define a recessed gasket channel for receiving the gasket 192. The endplates 116 sandwich the stack of center plates 114 such that the pocket 186b of the endplate 116b cooperate with the pocket of the topmost center plate 114 to form an additional coolant chamber 191.

Each of the cards 118 is disposed within one of the coolant chambers 190, 191. In the illustrated embodiment, each chamber 190, 191 receives a single card 118, but in other embodiments, multiple cards may be disposed within each of the coolant chambers. The cards 118 are disposed in the coolant chambers 190 such that the major faces 142 and 143 are spaced apart from the dividing walls 174. This allows coolant to flow over both of the major faces to effectuate efficient cooling of the power modules 134. The cards 118 are supported in the chambers by the spacers, e.g., the first and second projecting walls 144, 146. The spacers may be configured to support the cards in a middle of the chambers, i.e. distance between major face 142 and the associated dividing wall 174 is substantially equal to the distance between major face 143 and the associated dividing wall 174. For example, each card 118 may be secured by attaching first projecting wall 144 and the second projecting wall 146 to the top surface 176 of the dividing wall 174. Alternatively, the projecting walls may be attached to the bottom surface 178 of the dividing walls.

Each of the coolant chambers 190, 191 includes a first coolant passage 194 above the card and a second coolant passage 196 below the card to provide double-sided cooling. The first passage 194 is defined between the major side 142 and an upper wall of the chamber 190, and the second passage 196 is defined between the major side 143 and a lower wall of the chamber 190. The first passage 194 of the top chamber 191 is defined between the major side 142 and an upper wall of the chamber 191. In most instances, the upper wall is the bottom surface 178 of one of the dividing walls 174, and the lower wall is the top surface 176 of another of the dividing walls 174.

Figure 9:
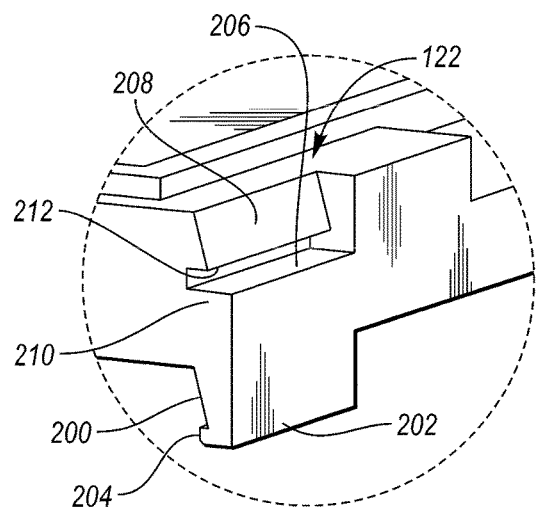
FIG. 9 is a perspective view of a connection feature for securing adjacent plates to each other.

Referring to FIGS. 7 and 9, as stated above, the stack 112 may be secured together by connection features 122 of the plates 114, 116. The connection features 122 may be a snap, a clip, or the like. For example, each connection feature 122 may include a first portion formed on one of the plates and a second portion formed on an adjacent plate. The first portion may be a projection 200 that extends from the bottom side of 166 the plate to engage with a receptacle 206 of the adjacent plate. The projection 200 may include a distal end 202 having a barb 204. The receptacle 206 may include an inclined surface 208 that guides the barb 204 into a groove 210 of the receptacle 206. A wall 212 of the groove 210 is configured to engage with the barb 204 to prevent the first and second portions from separating from each other.

Figure 10:
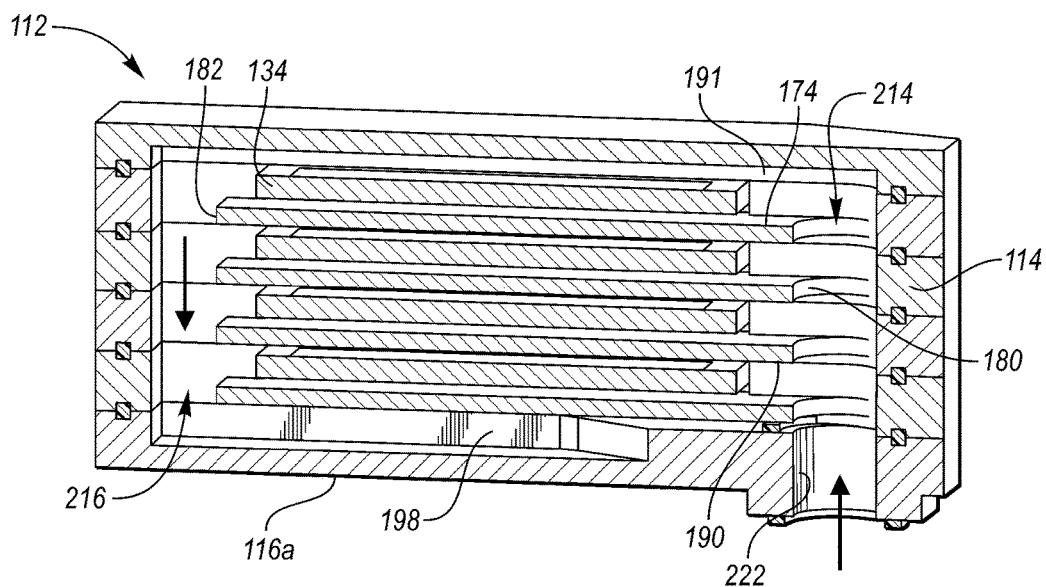
FIG. 10 is a cross-sectional view of the power-module assembly.

Referring to FIGS. 8 and 10, the stack 112 may have a parallel cooling arrangement where coolant flows from a supply side 214, through the chambers 190, 191, and to a return side 216. During operation, coolant is provided to the power-module assembly 110 via the manifold 128. The manifold 128 supplies coolant to the inlet 222 of the stack 112. The inlet 222 is in alignment with the inlet ports 180 of the dividing walls 174 allowing coolant to circulate axially through the stack 112. Coolant then flows from the supply side 214 into the chambers 190, 191 where the coolant is split between the first and second coolant passages 194 and 196. The coolant absorbs (or provides) thermal energy from the power modules 134 as it circulates over the cards. The outlet ports 182 of the dividing walls 174 are also in axial alignment allowing the coolant circulated back towards the end plate 116a. A return conduit 198 connects between the return side 216 and the outlet 132.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation.

What is claimed is:

1. A power-module assembly comprising:
    plates, each defining pockets, arranged in a stack such that the pockets cooperate to define coolant chambers interleaved with the plates; and
    cards including a power module encased in a frame having an outward projecting spacer, wherein each card is disposed in a corresponding one of the chambers with the spacer contacting a wall of the corresponding chamber to form a coolant passage between the wall and the card.

2. The power-module assembly of claim 1, wherein the chambers are in fluid communication with each other.

3. The power-module assembly of claim 1, wherein each plate includes a dividing wall having a first surface that defines a wall of one of the coolant chambers and a second surface that defines a wall of another of the coolant chambers.

4. The power-module assembly of claim 3, wherein each of the dividing walls defines an inlet opening and an outlet opening.

5. The power-module assembly of claim 3, wherein each of the spacers is attached to a corresponding one of the dividing walls.

6. The power-module assembly of claim 1, wherein each of the cards defines opposing major faces, and wherein the spacer is a portion of the frame that extends past the major face to attached to the wall of the corresponding chamber.

7. The power-module assembly of claim 1, wherein the spacer includes a pair of walls extending from a major face of the card.

8. The power-module assembly of claim 7, wherein the coolant passage is between the pair of walls.

9. The power-module assembly of claim 1, wherein the plates are secured together by a connection feature that includes a projection portion extending from a first of the plates, and a receptacle portion defined in a second of the plates and configured to receive the projection portion.

10. A power-module assembly comprising:
    plates each including first and second opposing major sides, a first pocket recessed into the first major side, a second pocket recessed into the second major side, and a dividing wall having a first surface that forms a floor of the first pocket and a second surface that forms a floor of the second pocket, wherein the plates are arranged in a linear stack such that adjacent ones of the first and second pockets cooperate to define coolant chambers interleaved with the dividing walls; and
    cards, each having opposing first and second major faces and including a power module encased in a frame that has a spacer extending from the second major face, wherein each of the cards is disposed in one of the coolant chambers with the spacer attached to a corresponding one of the dividing walls to support the card within the coolant chamber such that a first coolant passage is formed between the second major face of the card and the corresponding dividing wall and a second coolant passage is formed between the first major face of the card and another corresponding one of the dividing walls.

11. The power-module assembly of claim 10, wherein the spacer is a pair of walls.

12. The power-module assembly of claim 10, wherein the power module includes at least one switching unit.

13. A power-module assembly comprising:
stacked plates including adjacent first and second plates defining a first pocket and a second pocket, respectively, cooperating to form a coolant chamber, wherein the first and second plates are secured together by a connection feature that includes a projection portion extending from the first plate and a receptacle portion defined in the second plate and configured to receive the projection portion; and
a first card positioned in the coolant chamber such that a first coolant passage is defined between the first plate and the first card and a second coolant passage is defined between the second plate and the first card.

14. The power-module assembly of claim 13, wherein the first card has a spacer connected between a major face of the first card and the first plate.

15. The power-module assembly of claim 14, wherein the spacer is a wall that extends outward from the major face and is attached to the first card.

16. The power-module assembly of claim 13, wherein the first card includes a frame and a power module encased by the frame, the frame having a pair of spaced apart walls that extend past a major face of the first card to attach with the first plate.

17. The power-module assembly of claim 16, wherein the first coolant passage is defined between the spaced apart walls.

18. The power-module assembly of claim 13, wherein the projection portion is integrally formed with the first plate and the receptacle portion is integrally formed on the second plate.

19. The power-module assembly of claim 13, wherein the stacked plates include adjacent third and fourth plates defining a third pocket and a fourth pocket, respectively, cooperating to form a second coolant chamber, and further comprising a second card positioned in the second coolant chamber such that a third coolant passage is defined between the third plate and the second card and a fourth coolant passage is defined between the fourth plate and the second card.

* * * * *